US010541177B2

(12) United States Patent
Cheng et al.

(10) Patent No.: US 10,541,177 B2
(45) Date of Patent: *Jan. 21, 2020

(54) POROUS SILICON RELAXATION MEDIUM FOR DISLOCATION FREE CMOS DEVICES

(71) Applicant: INTERNATIONAL BUSINESS MACHINES CORPORATION, Armonk, NY (US)

(72) Inventors: Kangguo Cheng, Schenectady, NY (US); Ramachandra Divakaruni, Ossining, NY (US); Jeehwan Kim, Cambridge, MA (US); Juntao Li, Cohoes, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/214,935

(22) Filed: Dec. 10, 2018

(65) Prior Publication Data

US 2019/0109056 A1 Apr. 11, 2019

Related U.S. Application Data

(60) Continuation of application No. 15/846,968, filed on Dec. 19, 2017, now Pat. No. 10,229,857, which is a
(Continued)

(51) Int. Cl.
*H01L 21/84* (2006.01)
*H01L 27/12* (2006.01)
(Continued)

(52) U.S. Cl.
CPC ...... *H01L 21/845* (2013.01); *H01L 21/02236* (2013.01); *H01L 21/02532* (2013.01);
(Continued)

(58) Field of Classification Search
CPC ......... H01L 21/02236; H01L 21/02532; H01L 21/30604; H01L 21/326; H01L 21/823807;
(Continued)

(56) References Cited

U.S. PATENT DOCUMENTS 7,172,930 B2   2/2007 Adam et al.
7,566,606 B2   7/2009 Currie et al.
(Continued)

OTHER PUBLICATIONS

List of IBM Patents or Patent Applications Treated as Related dated Dec. 10, 2018, 2 pages.
(Continued)

*Primary Examiner* — Dao H Nguyen
(74) *Attorney, Agent, or Firm* — Tutunjian & Bitetto, P.C.; Erik Johnson

(57) ABSTRACT

A method for forming CMOS devices includes masking a first portion of a tensile-strained silicon layer of a SOI substrate, doping a second portion of the layer outside the first portion and growing an undoped silicon layer on the doped portion and the first portion. The undoped silicon layer becomes tensile-strained. Strain in the undoped silicon layer over the doped portion is relaxed by converting the doped portion to a porous silicon to form a relaxed silicon layer. The porous silicon is converted to an oxide. A SiGe layer is grown and oxidized to convert the relaxed silicon layer to a compressed SiGe layer. Fins are etched in the first portion from the tensile-strained silicon layer and the undoped silicon layer and in the second portion from the compressed SiGe layer.

10 Claims, 9 Drawing Sheets

Related U.S. Application Data continuation of application No. 15/363,420, filed on Nov. 29, 2016, now Pat. No. 9,917,021, which is a division of application No. 14/790,919, filed on Jul. 2, 2015, now Pat. No. 9,559,120.

(51) Int. Cl.

| | | |
|---|---|---|
| *H01L 27/092* | (2006.01) | |
| *H01L 21/8238* | (2006.01) | |
| *H01L 29/161* | (2006.01) | |
| *H01L 21/02* | (2006.01) | |
| *H01L 21/306* | (2006.01) | |
| *H01L 29/167* | (2006.01) | |
| *H01L 21/326* | (2006.01) | |
| *H01L 21/265* | (2006.01) | |
| *H01L 21/762* | (2006.01) | |
| *H01L 29/06* | (2006.01) | |
| *H01L 29/78* | (2006.01) | |

(52) U.S. Cl.
CPC .. *H01L 21/26506* (2013.01); *H01L 21/30604* (2013.01); *H01L 21/326* (2013.01); *H01L 21/7624* (2013.01); *H01L 21/823807* (2013.01); *H01L 21/823821* (2013.01); *H01L 27/0922* (2013.01); *H01L 27/0924* (2013.01); *H01L 27/1211* (2013.01); *H01L 29/0649* (2013.01); *H01L 29/161* (2013.01); *H01L 29/167* (2013.01); *H01L 29/785* (2013.01); *H01L 29/7849* (2013.01)

(58) Field of Classification Search
CPC ........... H01L 21/823821; H01L 21/845; H01L 21/26506; H01L 21/7624; H01L 27/1211; H01L 27/0922; H01L 27/0924; H01L 29/161; H01L 29/167; H01L 29/785; H01L 29/7849; H01L 29/0649
USPC ....... 438/264, 283, 285, 479, 504, 154, 157, 438/166; 257/351, 347, 368, 288, 401, 257/E21.563, E21.562, E21.409, E21.415, 257/E27.112, E27.062, E29.242, E29.255, 257/E29.286

See application file for complete search history.

(56) References Cited

U.S. PATENT DOCUMENTS

| | | | |
|---|---|---|---|
| 7,821,067 B2 | 10/2010 | Thean et al. | |
| 7,993,998 B2 | 8/2011 | Chen et al. | |
| 8,486,776 B2 | 7/2013 | Bedell et al. | |
| 8,617,968 B1* | 12/2013 | Cheng ............. | H01L 21/823807 257/18 |
| 8,895,381 B1 | 11/2014 | Cheng et al. | |
| 8,927,362 B2 | 1/2015 | Ching et al. | |
| 9,018,057 B1 | 4/2015 | Liu et al. | |
| 9,343,303 B2 | 5/2016 | Wang et al. | |
| 9,406,570 B2* | 8/2016 | Cheng ............. | H01L 21/823431 |
| 9,559,120 B2* | 1/2017 | Cheng ................. | H01L 27/1211 |
| 9,576,798 B2* | 2/2017 | Nguyen ............ | H01L 21/76251 |
| 9,917,021 B2* | 3/2018 | Cheng ................. | H01L 27/1211 |
| 9,929,060 B2* | 3/2018 | Cheng ................. | H01L 27/1211 |
| 10,229,857 B2* | 3/2019 | Cheng ................. | H01L 27/1211 |
| 2006/0125013 A1* | 6/2006 | Rim ....................... | H01L 21/84 257/351 |
| 2014/0008729 A1 | 1/2014 | Bedell et al. | |
| 2015/0021692 A1 | 1/2015 | Boeuf et al. | |

OTHER PUBLICATIONS

Anonymous, "Method for Epitaxial Growth on Si," IP.com, Dec. 2011. (pp. 1-6).

Anonymous, "A Method for Fabricating a Silicon On Insulator (SOI) Substrate with Two Types of Strain," IP.com, Sep. 2014. (pp. 1-6).

Anonymous, "Methods of Dual-Strain Devices on SOI," IP.com, Mar. 2015. (pp. 1-4).

Liu, Q., et al., "FDSOI CMOS Devices Featuring Dual Strained Channel and Thin BOX Extendable to the 10nm Node," IEEE International Electron Devices Meeting (IEDM), Dec. 2014. (pp. 1-4).

Schmidt, M., et al., "A Patterning-Based Strain Engineering for Sub-22 nm Node FinFETs," IEEE Electron Device Letters, vol. 35, No. 3. (pp. 1-3).

* cited by examiner

POROUS SILICON RELAXATION MEDIUM FOR DISLOCATION FREE CMOS DEVICES

BACKGROUND

Technical Field

The present invention relates to semiconductor processing, and more particularly to devices and methods for fabricating complementary metal oxide semiconductor (CMOS) devices having compressive and tensile stressed channel materials.

Description of the Related Art

Strain engineering is highly desired for boosting CMOS performance. Tensile strain is beneficial for N-type field effect transistors (NFETs), and compressive strain is beneficial for P-type field effect transistors (PFETs). Conventional external strain techniques such as, embedded source/drain, stress liner, etc. begin to lose their effectiveness due to highly scaled pitches and the three-dimensional (3D) nature of fin field effect transistors (finFETs).

Channel strain is one option that still works regardless of pitches and device architectures. However, forming a dually strained channel (tensile for NFET and compressive for PFET) is challenging.

SUMMARY

A method for forming complementary metal oxide semiconductor (CMOS) devices includes masking a first portion of a tensile-strained silicon layer of a silicon-on-insulator substrate with a hard mask. A second portion of the tensile-strained silicon layer is doped outside the first portion. The hard mask is removed. An undoped silicon layer is grown on the doped portion and the first portion, wherein the undoped silicon layer becomes a tensile-strained undoped silicon layer. Strain is relaxed in the undoped silicon layer over the doped portion by converting the doped portion to porous silicon to form a relaxed silicon layer. The porous silicon is converted to an oxide. A SiGe layer is grown on the relaxed silicon layer. The SiGe layer is oxidized to convert the relaxed silicon layer to a compressed SiGe layer. Fins are etched in the first portion from the tensile-strained silicon layer and the undoped silicon layer and in the second portion from the compressed SiGe layer.

A method for forming complementary metal oxide semiconductor devices includes masking a first portion of a tensile-strained silicon layer of a silicon on insulator substrate with a hard mask; etching a second portion of the tensile-strained silicon layer outside the first portion; doping the second portion of the tensile-strained silicon layer outside the first portion; growing an undoped silicon layer on the doped portion; removing the hard mask; relaxing strain in the undoped silicon layer over the doped portion by converting the doped portion to a porous silicon to form a relaxed silicon layer; converting the porous silicon to an oxide; growing a SiGe layer on the relaxed silicon layer; oxidizing the SiGe layer to convert the relaxed silicon layer to a compressed SiGe layer; etching fins in the first portion from the tensile-strained silicon layer and the undoped silicon layer and in the second portion from the compressed SiGe layer.

A complementary metal oxide semiconductor device includes a silicon on insulator substrate, first fins formed in a first region from a tensile-strained silicon layer on a buried dielectric layer of the substrate, a converted dielectric layer formed on the buried dielectric layer of the substrate in a second region and second fins formed in the second region in a compression-strained layer on the converted dielectric layer. The first and second fins include different heights. The first fins are included in N-type field effect transistors, and the second fins are included in P-type field effect transistors.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
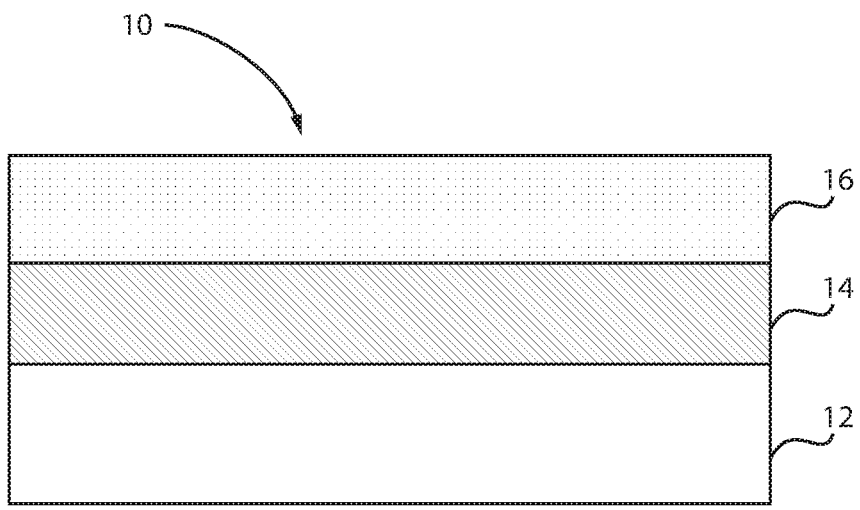
FIG. 1 is a cross-sectional view of a silicon on insulator substrate (SOI) with a tensily strained layer in accordance with the present principles.

In accordance with the present principles, methods and structures are provided for forming tensile strained NFETs and compressive strained PFETs on a same chip. Both NFETs and PFETs have a dielectric layer formed under a channel to provide improved isolation that is better than junction isolation. In accordance with useful embodiments, a tensily strained silicon-on-insulator (sSOI) has a hard mask formed thereon to cover an NFET region while a PFET region is exposed. In one embodiment, boron is doped in the sSOI in the PFET region followed by epitaxially growing undoped Si on top of the boron-doped sSOI. NFET and PFET active regions are then patterned. The boron-doped sSOI is converted into porous Si so that the epitaxy Si relaxes. The porous Si is converted into an oxide to serve as an anchor for the relaxed Si. Then, SiGe is epitaxially grown on top of the relaxed Si to form compressively strained SiGe for the PFET. In this way, both tensile and compressive regions (for NFETs and PFETs, respectively) are provided on a same chip It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that material compounds will be described in terms of listed elements, e.g., SiGe. These compounds include different proportions of the elements within the compound, e.g., SiGe includes $Si_xGe_{1-x}$ (or $Si_{1-x}Ge_x$) where x is less than or equal to 1, etc. In addition, other elements may be included in the compound, and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a silicon-on-insulator (SOI) substrate 10 or strained SOI (sSOI) includes a base 12, a buried dielectric layer 14 (e.g., a buried oxide or BOX) and tensily strained silicon layer 16. The base can be monocrystalline silicon, polycrystalline silicon, amorphous Si, and any other suitable materials.

Figure 2:
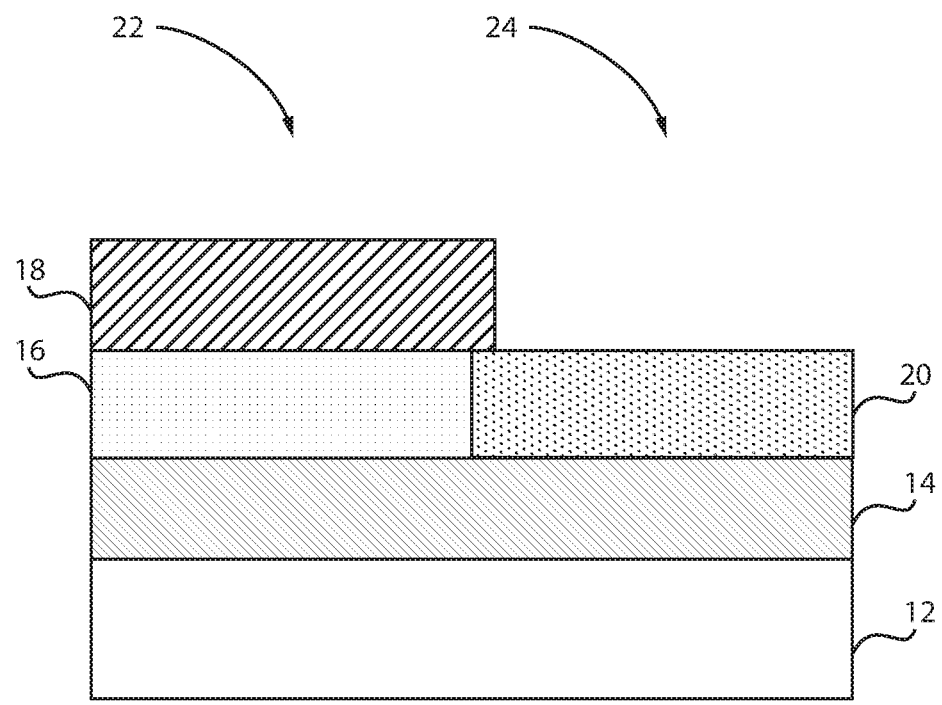
FIG. 2 is a cross-sectional view of the substrate of FIG. 1 having a hard mask to protect an NFET side while doping the tensily strained layer on the PFET side in accordance with the present principles.

Referring to FIG. 2, a hard mask 18 is deposited and patterned over the silicon layer 16. The hard mask 18 is patterned to differentiate a PFET region 24 and an NFET region 22 on the tensile-strained silicon layer 16 such that the NFET region 22 is covered by the hard mask 18 and exposes the layer 16 in the PFET region 24. The hard mask 18 may include silicon nitride (SiN) although other suitable materials may be employed.

Boron or other similar dopants are introduced into the tensile-strained silicon layer 16 in the PFET region 24. The doping process for introducing dopants into a doped region 20 in the PFET region 24 may include, e.g., solid phase doing, gas phase doping, or implantation. When needed, a dopant activation anneal (e.g., rapid thermal anneal, laser anneal, flash anneal) can be performed after the doping process. The doping concentration in the region 20 in the PFET region 24 may range from $3\times10^{18}/cm^3$ to $1\times10^{21}/cm^3$. More preferably, the doping concentration in the region 20 in the PFET region may range from $1\times10^{19}/cm^3$ to $4\times10^{20}/cm^3$.

Figure 3:
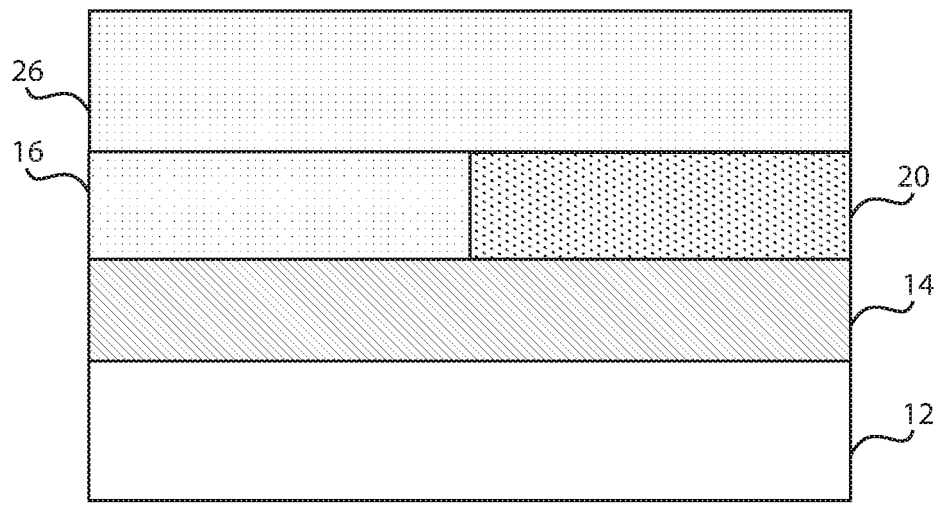
FIG. 3 is a cross-sectional view of the substrate of FIG. 2 having an undoped epitaxial layer formed on the tensily strained layer and doped layer on the PFET side in accordance with the present principles.

Referring to FIG. 3, the hard mask 18 is removed and an undoped Si layer 26 is epitaxially grown. The epitaxially grown Si layer 26 follows the lattice of the tensile-strained silicon layer 16 so the epitaxially grown Si layer 26 is also tensily strained. The epitaxially grown undoped Si layer 26 is formed over the tensile-strained silicon layer 16 in both the NFET region 22 and the PFET region 24. Undoped means the doping concentration is less than $1\times10^{17}/cm^3$.

Figure 4:
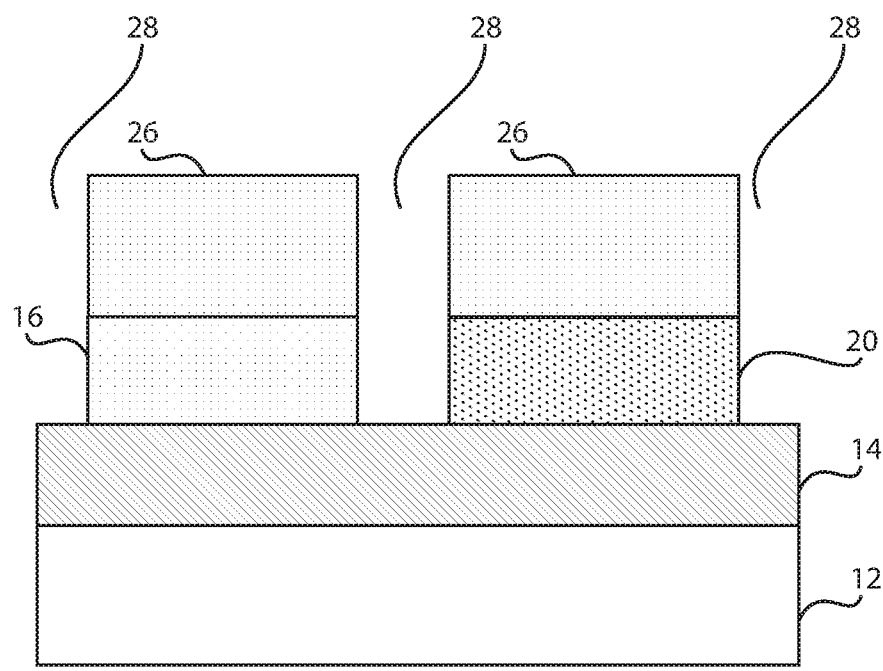
FIG. 4 is a cross-sectional view of the substrate of FIG. 3 having NFET and PFET regions defined by shallow trenches in accordance with the present principles.

Referring to FIG. 4, shallow trench isolation (STI) trenches 28 are etched into the layers 26 and 16 down to the buried dielectric layer 14. This patterns and defines active regions for NFETs and PFETs.

Figure 5:
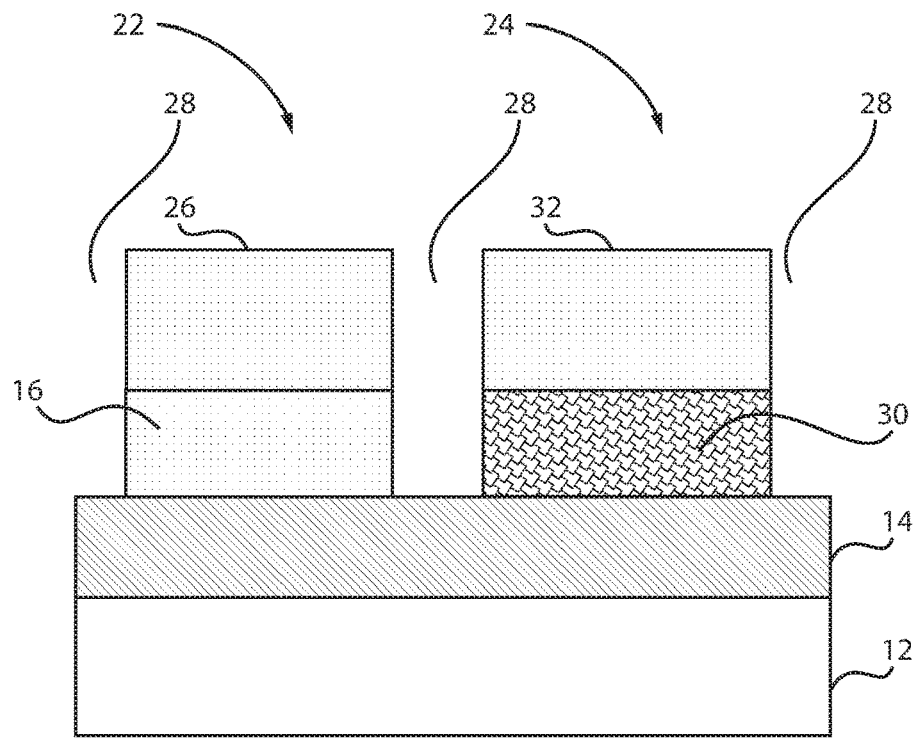
FIG. 5 is a cross-sectional view of the substrate of FIG. 4 having the doped layer converted to porous Si in accordance with the present principles.

Referring to FIG. 5, the doped region 20 is converted into a porous Si region 30 this in turn relaxes the epitaxially grown Si layer 26 over the region 30 to provide a relaxed Si portion 32. The doped region 20 can be converted into porous Si 30 by, e.g., an anodization process. In the PFET region 24, the originally tensile-strained silicon layer 16 (now porous silicon region 30) is relaxed and the original layer 26 (now layer 32) on top of porous Si 30 also relaxes (porous Si has a very low Young's modulus). In the NFET region 22, the epitaxially grown undoped Si layer 26 follows lattice of the tensile-strained silicon layer 16 so the is still the layer 26 remains tensily strained.

To show that the porous Si 30 also relaxes: let sSi=strained Si, pSi=porous Si, E is Young's modulus, $E_{Si}$: ~170 Gpa; $E_{pSi}$~17 GPa with ~50% porosity. So $E_{Si}$~10 $E_{pSi}$. Only 10% strain remains in sSi, this means 90% relaxation is achieved.

Figure 6:
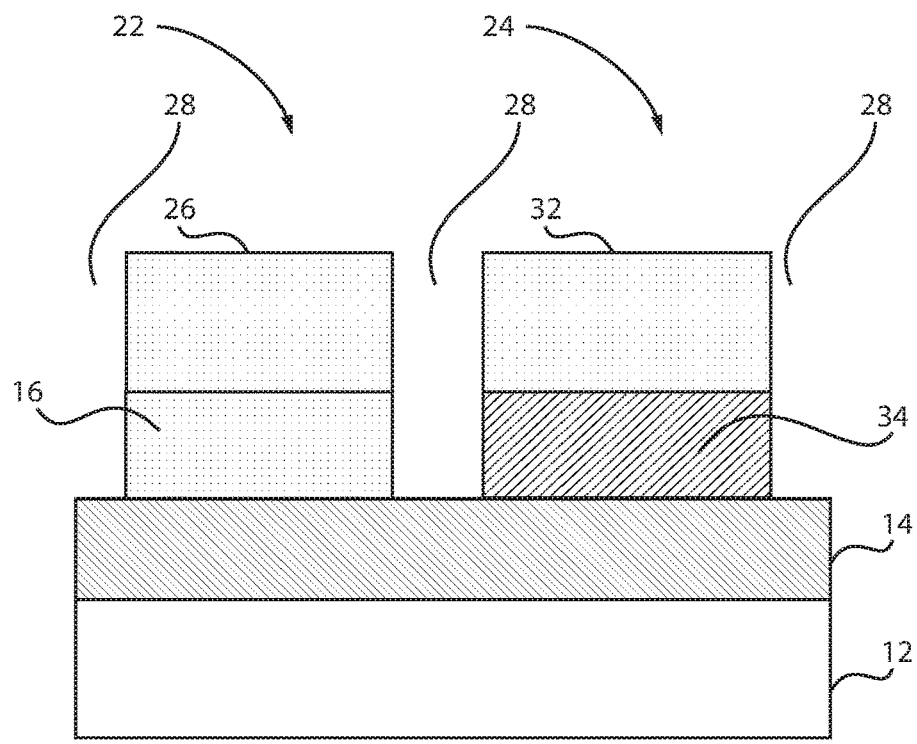
FIG. 6 is a cross-sectional view of the substrate of FIG. 5 having the doped layer converted to oxide in accordance with the present principles.

Referring to FIG. 6, the porous Si 30 is converted into an oxide layer 34 to serve as an anchor for the relaxed Si layer 32. A low temperature oxidation (e.g., less than about 400 degrees C.) may be employed to oxidize the porous Si layer 30 to convert it into oxide. Porous Si (32) can be oxidized at a rate of about 100 times greater than non-porous Si.

Figure 7:
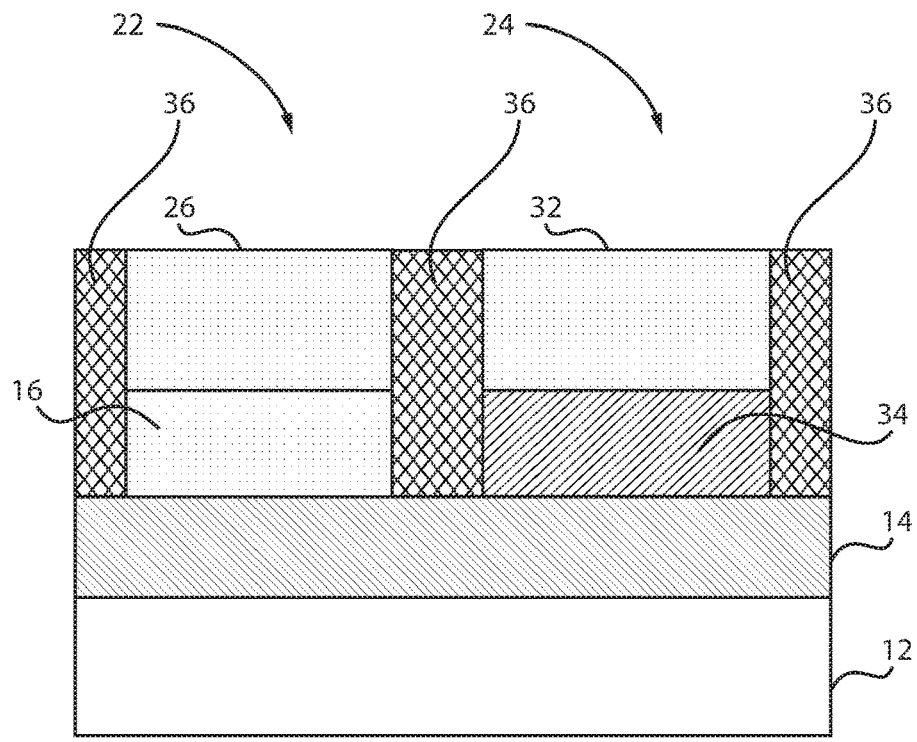
FIG. 7 is a cross-sectional view of the substrate of FIG. 6 having shallow trenches filled in accordance with the present principles.
Figure 8:
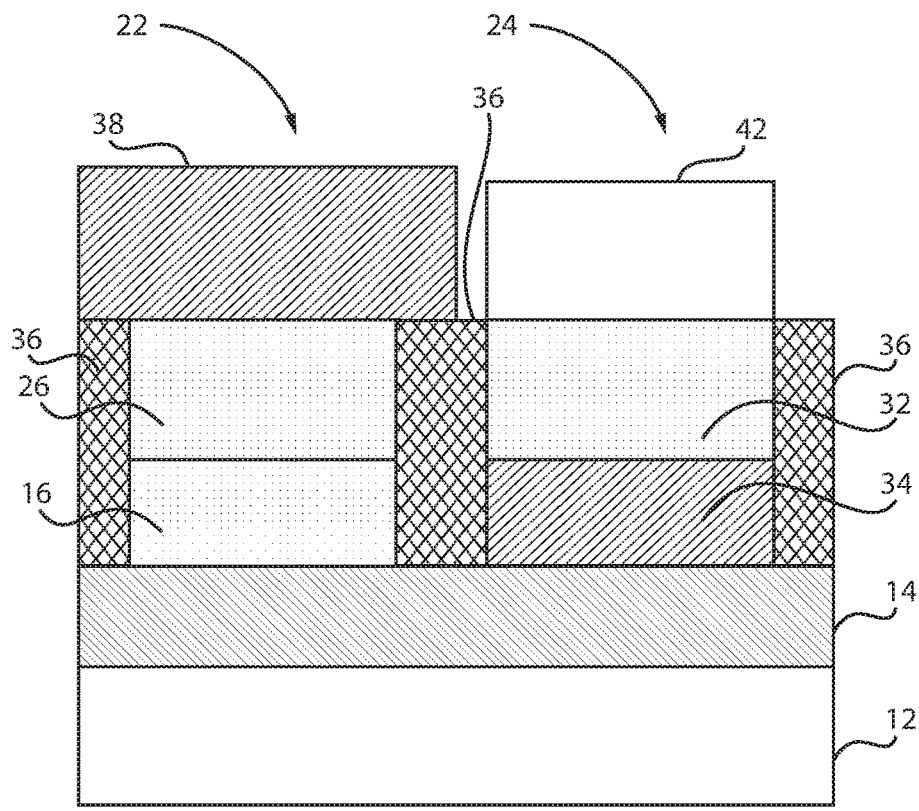
FIG. 8 is a cross-sectional view of the substrate of FIG. 7 having an epitaxially grow SiGe layer formed on a relaxed silicon layer in accordance with the present principles.

Referring to FIG. 7, an STI fill process is performed to form STI regions 36. This may include depositing a dielectric material (e.g., oxide) and then planarizing a top surface (e.g., by chemical mechanical polishing (CMP)).

Referring 8, process steps will be described now for forming compressively strained SiGe in the PFET region 24. A hard mask 38, e.g., formed from a nitride material or other suitable materials (e.g., silicon oxide), is applied and patterned to cover the NFET region 22. A SiGe layer 42 is epitaxially grown on top of the relaxed Si layer 32. The SiGe layer 42 is compressively strained as formed. The epitaxially grown SiGe layer 42 is formed for the PFET region 24.

Figure 9:
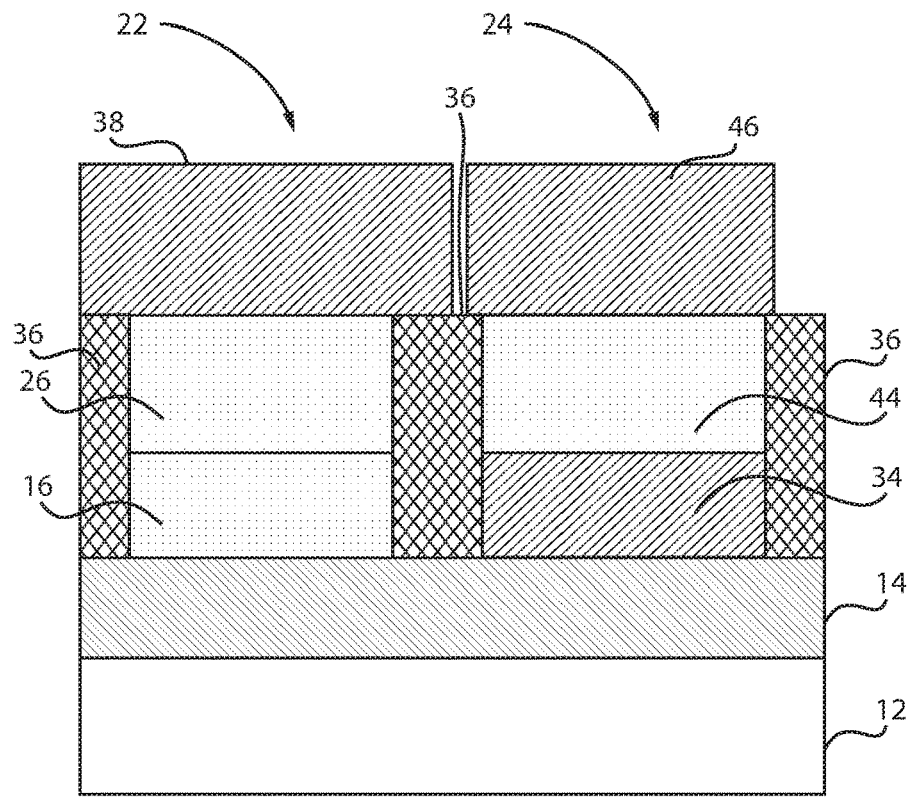
FIG. 9 is a cross-sectional view of the substrate of FIG. 8 having the epitaxially grow SiGe layer condensed and oxidized to form a SiGe layer from the relaxed silicon layer in accordance with the present principles.

Referring to FIG. 9, a condensation process is employed to convert the SiGe layer 42 into an oxide layer 46 and turn the relaxed Si layer 32 into a compressively strained SiGe (cSiGe) layer 44. The condensation process includes exposing the SiGe layer 42 to heat (e.g., 400-1050 degrees C.) in the presence of oxygen to oxidize the Si in the SiGe layer to free up Ge. The Ge condenses out and is diffused into the relaxed Si layer 32 to form the compressive-strained SiGe layer 44.

Figure 10:
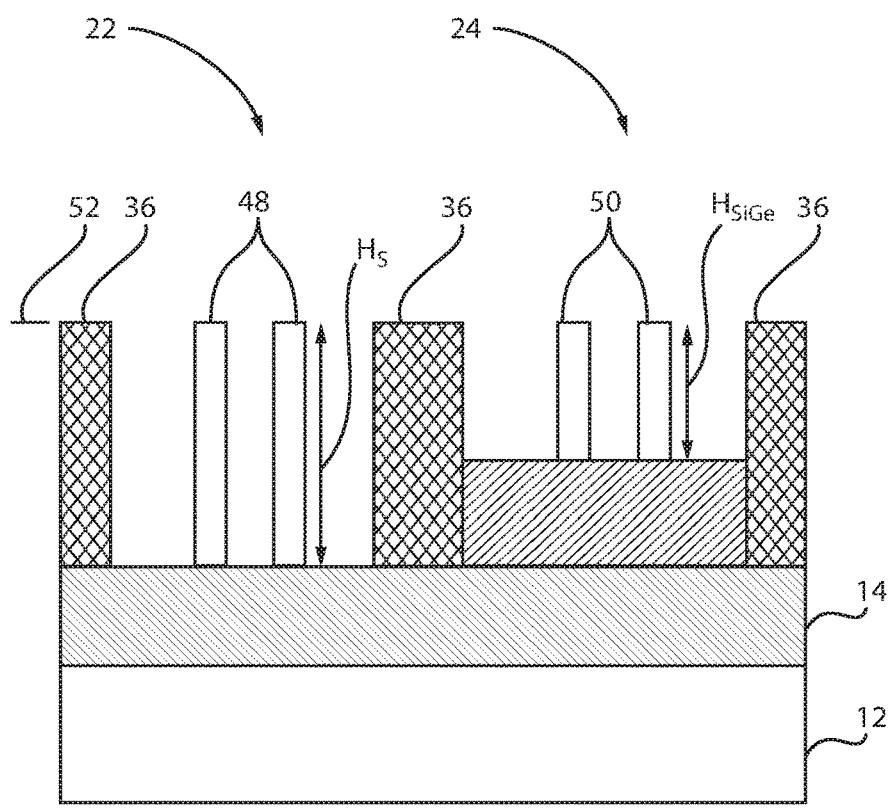
FIG. 10 is a cross-sectional view of the substrate of FIG. 9 having NFET and PFET fins formed in accordance with the present principles.

Referring to FIG. 10, fins are formed for in both the NFET region 22 and the PFET region 24. Fins 48 in the NFET region 22 are etched using a reactive ion etch (RIE) process with a patterned mask (not shown). The fins 48 are formed from tensile-strained Si. Fins 50 in the PFET region 24 are etched using a reactive ion etch (RIE) process with a patterned mask (not shown). The fins 50 are formed from compressive-strained Si. The fins 48, 50 are employed to form complementary metal oxide semiconductor (CMOS) devices, namely fin field effect transistors (finFETs). The finFETs include tensile NFETs, and compressive PFETs.

Tensile Si fins 48 and compressive SiGe fins 50 are formed different thicknesses of dielectric. Fins 48 are formed on the buried dielectric layer 14 and the fins 50 are formed on the buried dielectric layer 14 and the oxide layer 34. The fins 48, 50 also provide different fin heights ($H_{Si}$>$H_{SiGe}$). This enables a non-integer N/P ratio (NFET/PFET). The difference between NFET and PFET fin heights can be determined by the starting thickness of the silicon layer 16. In addition, all fin tops are provided at a same level 52. Therefore, no additional process complexity is added in accordance with the present principles.

Figure 11:
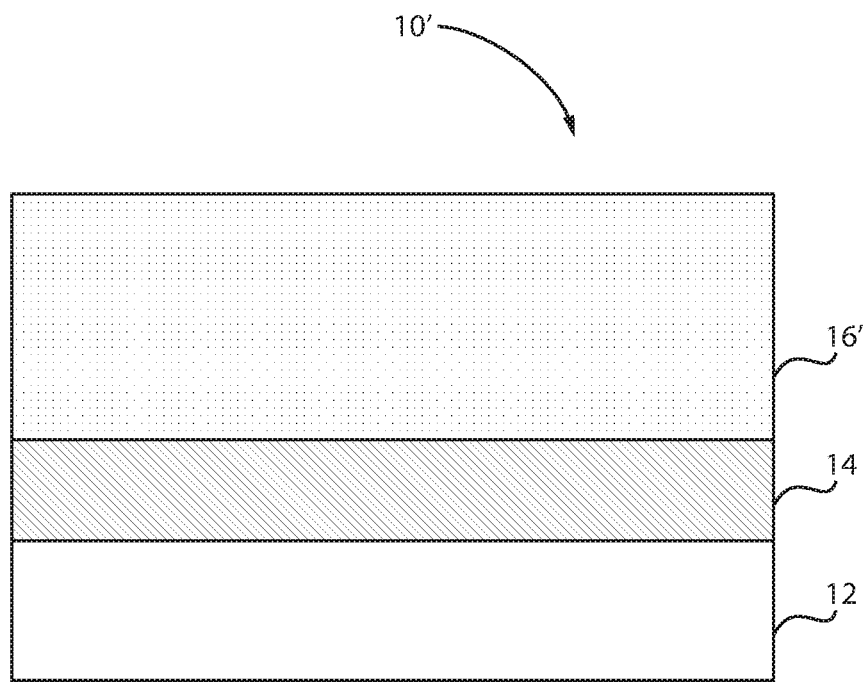
FIG. 11 is a cross-sectional view of a silicon on insulator substrate (SOI) with a large tensily strained layer in accordance with another embodiment.

Referring to FIG. 11, a silicon-on-insulator (SOI) substrate 10' or strained SOI (sSOI) includes a monocrystalline silicon base 12, a buried dielectric layer 14 (e.g., a buried oxide or BOX) and tensily strained silicon layer 16' that is sized in accordance with fins to be formed.

Figure 12:
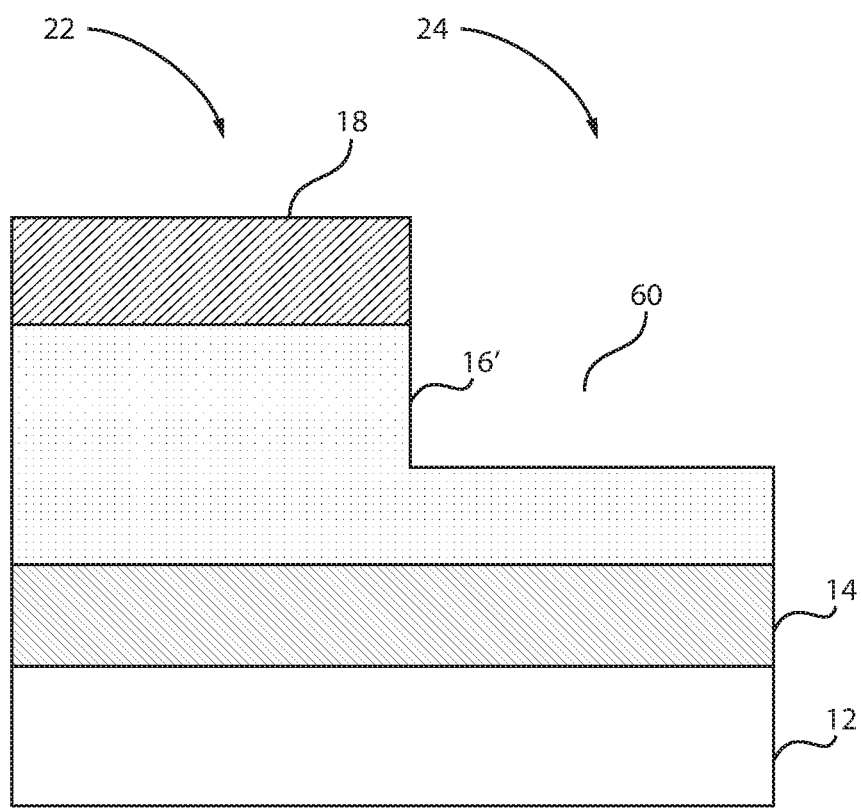
FIG. 12 is a cross-sectional view of the substrate of FIG. 11 having a hard mask to protect an NFET side while etching the tensily strained layer on the PFET side in accordance with the present principles.

Referring to FIG. 12, a hard mask 18 is deposited and patterned over the silicon layer 16'. The hard mask 18 is patterned to differentiate an NFET region 22 and an PFET region 24 on the tensile-strained silicon layer 16' such that the NFET region 22 is covered by the hard mask 18 and exposes the layer 16' in the PFET region 24. The hard mask 18 may include silicon nitride although other suitable materials may be employed. An etch process is performed to form a recess 60 in the layer 16' in the PFET region 24.

Figure 13:
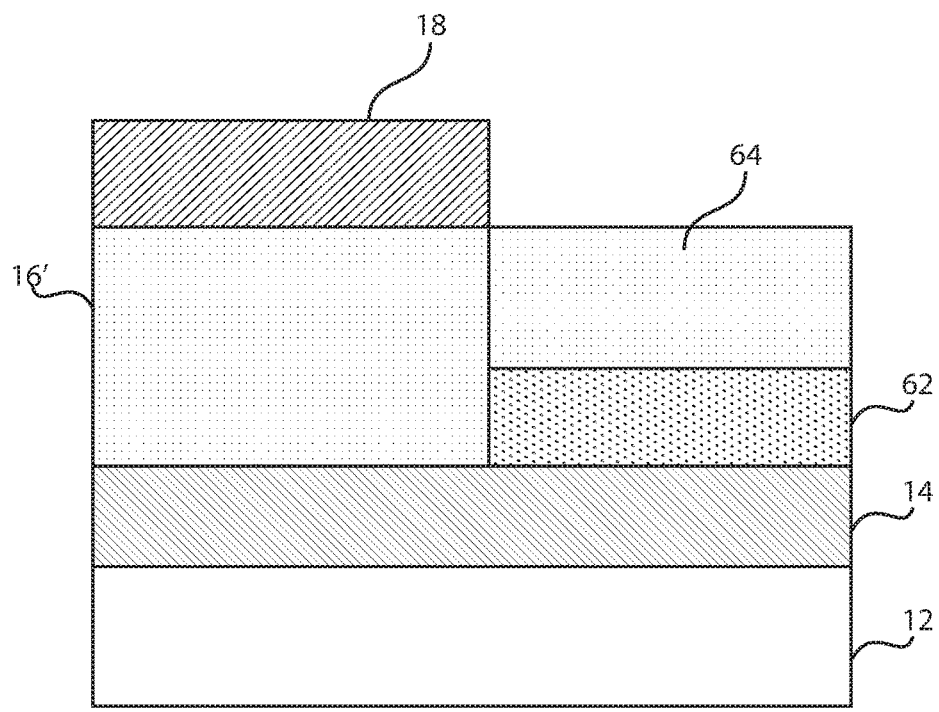
FIG. 13 is a cross-sectional view of the substrate of FIG. 12 having a doped portion of the tensily strained layer on the PFET side and an undoped upper portion grown on the lower portion in accordance with the present principles.

Referring to FIG. 13, boron or other similar dopants are introduced into the tensile-strained silicon layer 16' in the PFET region 24. The doping process for introducing dopants into a doped region 62 in the PFET region 24 may include, e.g., solid phase doing, gas phase doping, or implantation. An undoped Si layer 64 is epitaxially grown on the doped region 62. Both the doping and the epitaxial growth can be done together in an epitaxial tool or the steps may be performed separately in different tools or at different times.

Figure 14:
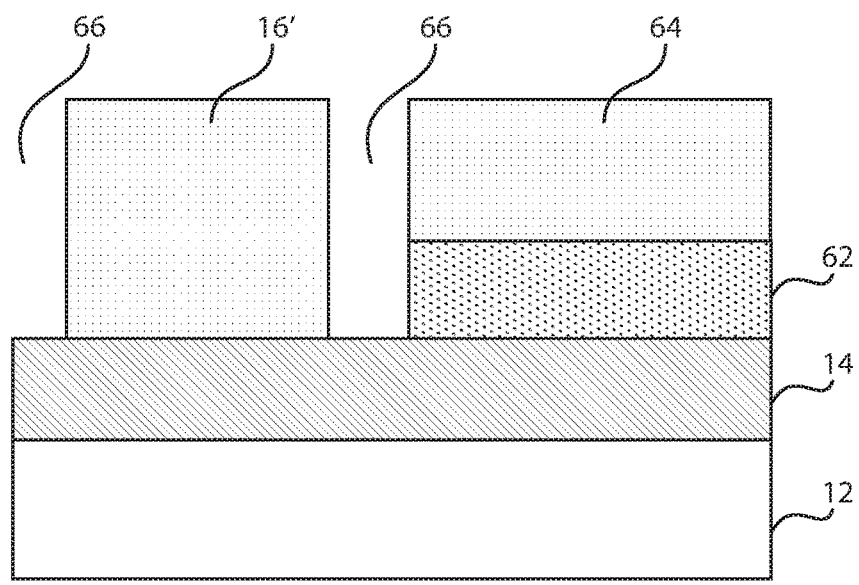
FIG. 14 is a cross-sectional view of the substrate of FIG. 13 having NFET and PFET regions defined by shallow trenches in accordance with the present principles.

Referring to FIG. 14, the hard mask 18 is removed. Shallow trench isolation (STI) trenches 66 are etched into the layers 26 and 16 down to the buried dielectric layer 14. This patterns and defines active regions for NFETs and PFETs.

Figure 15:
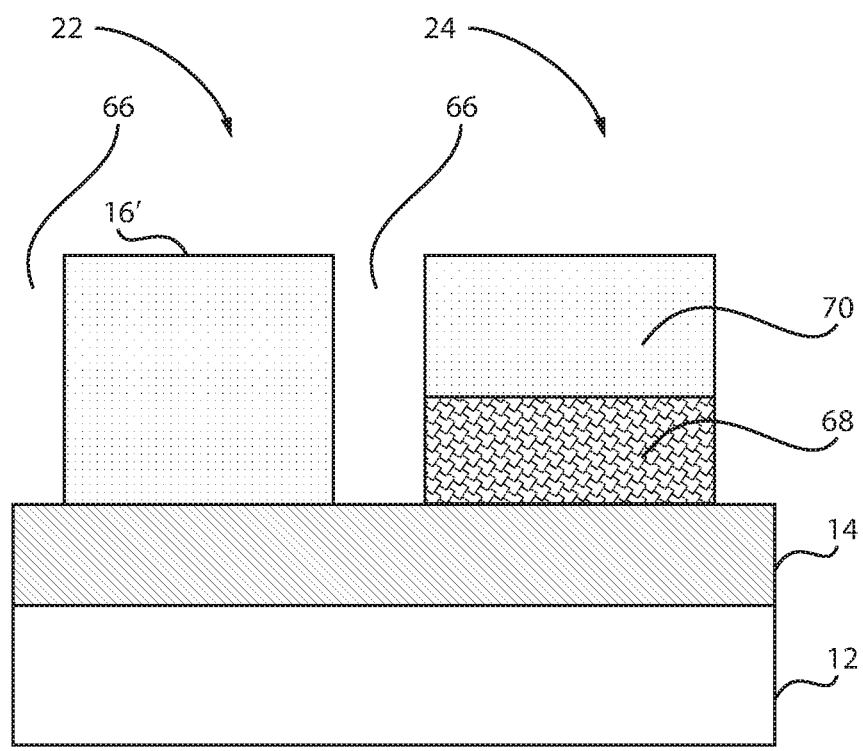
FIG. 15 is a cross-sectional view of the substrate of FIG. 14 having the doped layer converted to porous Si in accordance with the present principles.

Referring to FIG. 15, the doped region 62 is converted into porous Si layer 68 (e.g., by anodization). In the PFET region 24, the undoped Si layer 64 on top of the porous Si layer 68 relaxes. In the NFET region 22, the Si layer 16' is still tensily strained. The process continues as described above.

It should be understood that the actual remaining strain in sSi after porous Si patterning can be further engineered base on a starting sSi thickness, porous Si thickness, the amount of porosity in the porous Si and other factors. As long as the majority (e.g., at least about 50-60% or more) of the strain in the sSi is relaxed in PFET region 24, the epitaxial SiGe layer 42 on top of the relaxed Si will be compressively strained. There is no need for 100% relaxation of sSi (of course, 100% relaxation is better than 90%).

Figure 16:
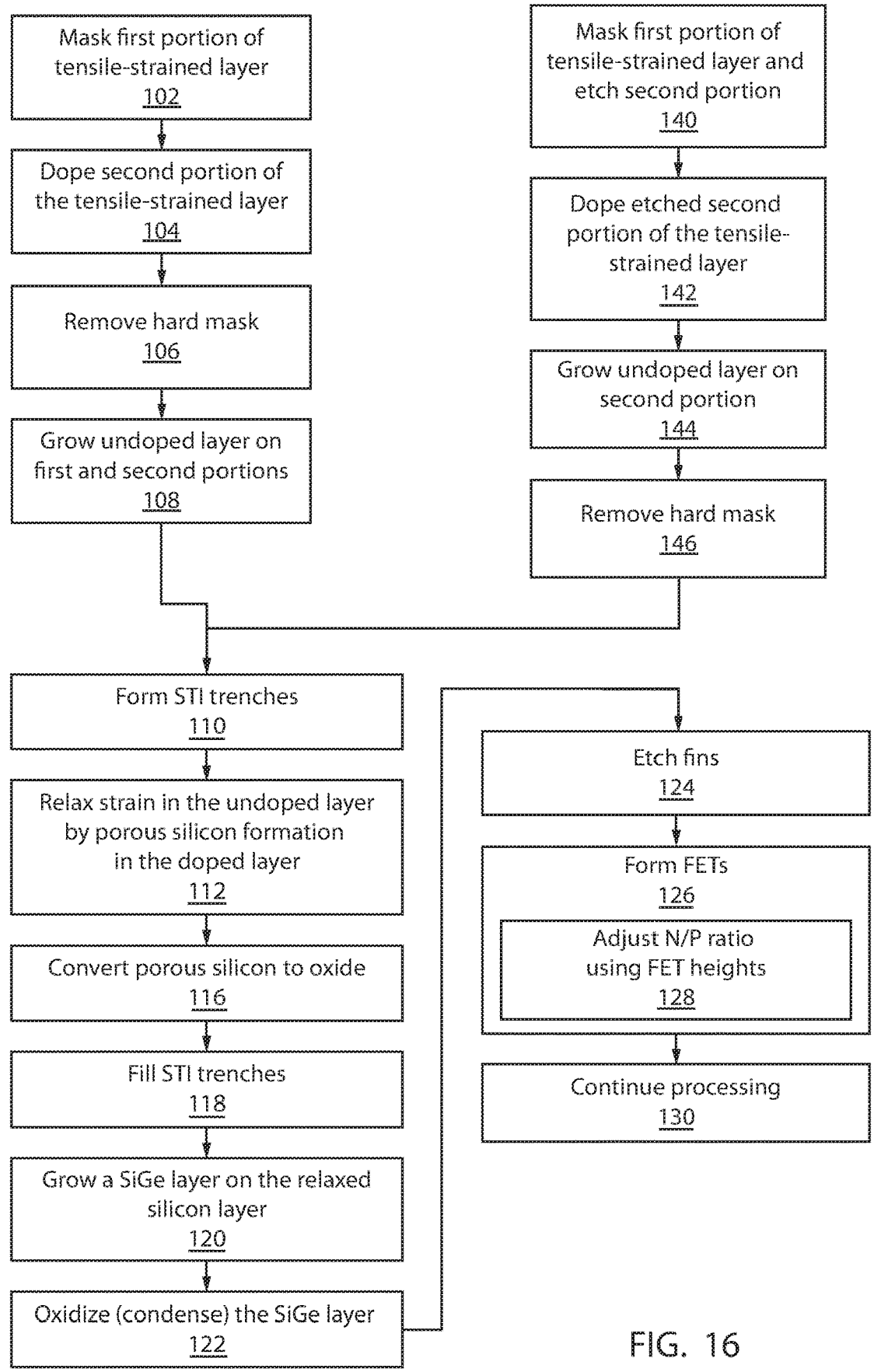
FIG. 16 is a block/flow diagram showing a method for forming complementary metal oxide semiconductor devices in accordance with one illustrative embodiment.

Referring to FIG. 16, methods for forming complementary metal oxide semiconductor devices are described in accordance with illustrative embodiments. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In one embodiment, in block 102, a first portion of a tensile-strained silicon layer of a silicon on insulator substrate is masked. The mask may include a SiN hard mask patterned using lithography or other process. In block 104, a second portion of the tensile-strained silicon layer is doped outside the first portion. The doping may include boron doing although other dopants may be employed. The doping may include solid phase, gas phase or implant doping.

In block 106, the hard mask is removed. In block 108, an undoped silicon layer is grown on the doped portion and the first portion, wherein the undoped silicon layer becomes a tensile-strained undoped silicon layer.

In an alternate embodiment, in block 140, a second portion of the tensile-strained silicon layer is etched outside the first portion using a hard mask. The tensile-strained silicon layer includes a thickness has the thickness of both the strain silicon layer and the undoped silicon layer described in blocks 102 and 108. In block 142, the second portion of the tensile-strained silicon layer is doped outside the first portion (e.g., with boron). In block 144, an undoped silicon layer is grown only on the doped portion. In block 146, the hard mask is removed.

Both of the above methods continue as follows: In block 110, shallow trench isolation (STI) trenches may be formed at least between the first portion and the doped portion. In block 112, strain in the undoped silicon layer over the doped portion is relaxed by converting the doped portion to a porous silicon to form a relaxed silicon layer. The doped portion may be converted to the porous silicon having or a porosity of at least 50%. Other porosities may also be employed. The strain is relaxed strain by at least 50%, greater relaxation percentages are preferable (e.g., up to and including 100%).

In block 116, the porous silicon is converted to an oxide. This may include anodizing the doped portion. In block 118, the STI trenches may be filled. In block 120, a SiGe layer is grown on the relaxed silicon layer. In block 122, the SiGe layer is oxidized to convert the relaxed silicon layer to a compressed SiGe layer. A condensation process may be employed to form the compressed SiGe layer. In one embodiment, the condensation process includes a temperature of between about 400 degrees C. and 1050 degrees for one or more cycles (or less than a minute each) in the presence of oxygen.

In block 124, fins are etched in the first portion from the tensile-strained silicon layer and the undoped silicon layer, and in the second portion from the compressed SiGe layer. In block 126, N-type field effect transistors are formed from the fins formed from the tensile-strained silicon layer and the tensile-strained silicon layer. P-type field effect transistors are formed from the compressed SiGe layer. In block 128, the N-type field effect transistors and the P-type field effect transistors have different heights and the heights are adjusted to adjust N/P ratio. The heights can be adjusted based on a starting height of the silicon layers, porosity of the porous silicon, the porous silicon thickness, etc. In block 130, processing continues to complete the device.

Having described preferred embodiments for porous silicon relaxation medium for dislocation free CMOS devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for forming complementary metal oxide semiconductor devices, comprising:
   doping a second portion of a tensile-strained silicon layer outside a first portion to form a doped portion;
   growing an undoped silicon layer on the doped portion;
   relaxing strain in the undoped silicon layer over the doped portion by converting the doped portion to an oxide to form a relaxed layer;
   growing a SiGe layer on the relaxed layer;
   oxidizing the SiGe layer to convert the relaxed layer to a compressed SiGe layer; and
   etching fins from the tensile-strained silicon layer and the compressed SiGe layer.

2. The method as recited in claim 1, wherein doping the second portion of the tensile-strained silicon layer includes boron doping the second portion.

3. The method as recited in claim 1, wherein converting the doped portion to an oxide to form a relaxed layer includes converting the doped portion to a porous silicon then converting the porous silicon to the oxide.

4. The method as recited in claim 3, wherein converting the doped portion to a porous silicon includes converting the doped portion to the porous silicon with a porosity of at least 50%.

5. The method as recited in claim 1, wherein oxidizing the SiGe layer to convert the relaxed silicon layer to a compressed SiGe layer includes employing a condensation process to form the compressed SiGe layer.

6. The method as recited in claim 1, further comprising forming N-type field effect transistors from the fins formed from the tensile-strained silicon layer and forming P-type field effect transistors from the fins formed from the compressed SiGe layer.

7. The method as recited in claim 6, wherein the N-type field effect transistors and the P-type field effect transistors have different heights and the method further comprises adjusting the heights to adjust N/P ratio.

8. The method as recited in claim 1, wherein relaxing strain in the undoped silicon layer includes relaxing strain by at least 50%.

9. The method as recited in claim 1, wherein converting the doped portion to a porous silicon to form a relaxed silicon layer includes anodizing the doped portion.

10. The method as recited in claim 1, further comprising removing a hard mask.

* * * * *